United States Patent [19]
Arkin

[11] Patent Number: 6,060,898
[45] Date of Patent: May 9, 2000

[54] FORMAT SENSITIVE TIMING CALIBRATION FOR AN INTEGRATED CIRCUIT TESTER

[75] Inventor: Brian J. Arkin, Pleasanton, Calif.

[73] Assignee: Credence Systems Corporation, Fremont, Calif.

[21] Appl. No.: 08/941,452

[22] Filed: Sep. 30, 1997

[51] Int. Cl.⁷ .................................................. G01R 31/26
[52] U.S. Cl. ........................ 324/765; 324/532; 324/158.1
[58] Field of Search ................................... 324/532, 535, 324/537, 765, 158.1

[56] References Cited

U.S. PATENT DOCUMENTS

| | | | |
|---|---|---|---|
| 5,225,775 | 7/1993 | Sekino | 324/158.1 |
| 5,917,834 | 6/1999 | Arkin | 324/765 X |

Primary Examiner—Glenn W. Brown
Attorney, Agent, or Firm—Smith-Hill and Bedell

[57] ABSTRACT

Each channel of an integrated circuit tester includes at least one timing signal generator for producing an output timing signal for triggering various types of test events carried out by the tester channel. At the start of each cycle of a test, each timing signal generator receivies input timing data referencing a time at which a test event is to occur and also receives input format data indicating the format of that test event. Each timing signal generator then generates its output timing signal before the event time referenced by the timing data with a lead time selected by the input format data. Each timing signal generator may be independently calibrated such that the format data always selects the appropriate lead time for the event to be triggered so that each type of event occurs at the time indicated by the input timing data regardless of the nature of the event being triggered.

15 Claims, 2 Drawing Sheets

FORMAT SENSITIVE TIMING CALIBRATION FOR AN INTEGRATED CIRCUIT TESTER

BACKGROUND OF THE INVENTION

1. Field of the Invention

The present invention relates in general to integrated circuit (IC) testers and in particular to an integrated circuit tester employing timing circuits having format sensitive timing calibration.

2. Description of Related Art

A typical per-pin integrated circuit tester includes a pattern generator and a set of tester channels, one for each pin of an integrated circuit device under test (DUT). The tester organizes each test into a set of successive test cycles, and during each test cycle each channel may initiate one or more test events at a corresponding DUT pin. A test event may be, for example, a change in state of a test signal supplied to the DUT terminal or the sampling of a DUT output signal at the terminal to determine whether the DUT output signal is behaving as expected.

The tester includes a pattern generator for supplying "format set" (FSET) data, "time set" (TSET) data and reference data (PG) to each tester channel for each test cycle. The FSET data and PG data together refer to a particular drive or compare format the channel is to use during the test cycle. The term "drive format" refers to the manner in which the channel controls the states of a test signal it may supply to the DUT terminal during the test cycle. The term "compare format" refers to the manner in which the channel samples and compares a DUT output signal to determine whether the DUT output signal is behaving as expected during the test cycle. The TSET data indicates times during a cycle at which events are to occur. The reference data PG can be used in conjunction with the FSET data to reference a particular drive format. When the FSET data specifies a compare format, the PG data typically indicates expected states of the DUT output signal. Each channel carrying out a compare format produces a "FAIL" signal when the DUT output signal it monitors does not match its expected state.

A typical tester channel includes a pin electronics circuit for generating a test signal at the DUT in response to a set of drive control signals indicating the test signal state (e.g., high, low or tristate). The pin electronics circuit also monitors any DUT output signal produced at the terminal and produces compare high (CH) and compare low (CL) signals indicating whether the DUT output signal is currently above a specified high logic level or below a specified low logic level. In addition to a pin electronics circuit, each tester channel also includes one or more timing signal generators and a formatter circuit. Each timing signal generator receives the TSET data from the pattern generator at the start of each test cycle and produces a timing signal pulse input to the formatter circuit with a delay following the start of the test cycle controlled by the TSET data. The formatter circuit receives the FSET and PG data from the pattern generator, the timing signals produced by the timing signal generators and the CH and CL signals from the pin electronics circuit and produces the control signal inputs to the pin electronics circuit and the output FAIL signal. The FSET and PG data indicate the drive or compare format to be carried out during a test cycle and also indicate which timing signals are to control the timing of events within the indicated format.

In order for a test to be successful, the timing of test events at the various DUT terminals must be precisely coordinated. The timing signal generators of all tester channels use the same master clock signal as a timing reference so that they can coordinate the timing of their output timing signals. However a number of factors introduce errors into their timing coordination. For example, since the tester channels are distributed in space, the master clock signal may not arrive concurrently at the various timing signal generators. Also signals paths between the tester channels and the DUT terminals they access may vary in distance. Thus a test signal from one channel may take longer to reach a DUT terminal than another, or one DUT output signal may take longer to reach a tester channel than another. Moreover, while the tester channels are typically of similar construction, process and temperature variation between the integrated circuit devices forming the separate tester channels can cause differences in the amount of time they require to actually make a test event happen in response to a timing signal.

To reduce these timing differences between channels, each timing signal generator is typically provided with a separate programmable delay circuit for adjustably delaying its output timing signal. The amount of delay provided by the delay circuit is controlled by calibration data stored in a register. To calibrate the tester, all of the tester channels may, for example, be connected to terminals of a device such as an oscilloscope that can measure timing differences between signals applied to its terminals. The tester is then programmed so that all tester channels are expected to produce output test signals concurrently. If the oscilloscope shows that the test signal produced by any one channel lags or leads the others, the calibration data in the control register for the delay circuit of the timing signal generator that triggered the lagging or leading test signal is adjusted accordingly. Thus channel-to-channel variation in the delay between timing signal generation and test signal state change is substantially eliminated.

One of the heretofore unresolved problems associated with timing calibration has been that the delay between timing signal generation and test event varies not only from channel-to-channel but from event format-to-format. For example, in one drive format a test signal is driven high in response to a timing signal while in another drive format the test signal is driven low in response to the test signal. Each event format requires the timing signal to travel a separate path through the tester channel on its way to triggering the state change event because each state change event is implemented by a separate set of logic devices within the tester channel. Since each kind of event requires the timing signal to follow a different signal path, and since different signal paths have differing inherent delays, the delay between a timing signal and the event it triggers depends on the nature of the event being triggered.

Drive and compare formats have markedly differing timing requirements. For drive formats, a timing signal that is to trigger a change in state of a test signal at some time specified by the TSET data should lead the specified time by an appropriate amount to account for the inherent delay between the timing signal generator and the DUT terminal. On the other hand, if a channel is to sample and compare a DUT output signal to determine its state at the specified time, the sample and compare operation should be carried out some time after the specified time to account for the time the DUT output signal requires to travel to a sampling circuit within the channel. Therefore the timing signal that triggers a compare event should be produced later than a timing signal that triggers a drive event relative to the time specified by the TSET data.

Thus when timing delay is calibrated to provide a standardized signal path delay for one kind of event format, that timing calibration may not be accurate when the channel subsequently carries out another kind of event format. Some improvement to this timing problem has be achieved by determining the value of calibration data needed to optimize timing for a variety of test formats and then averaging the results to produce the timing calibration data values actually used. This procedure minimizes the maximum possible timing error for any one kind of event format. Nonetheless format sensitive timing calibration errors remain and these errors limit the tester's timing resolution. As integrated circuit speed continues to increase, we must improve the timing resolution of the machines that test them. Thus small format sensitive timing calibration errors must be made smaller.

SUMMARY OF THE INVENTION

An integrated circuit tester in accordance with the present invention is an improvement to a conventional IC tester of the type which includes a pattern generator and a set of tester channels. Each tester channel carries out a sequence of test events at a separate pin of an integrated circuit device under test (DUT) in response to a sequence of time set data (TSET), format set data (FSET) and reference data (PG) read out of the pattern generator and supplied to each tester channel for each test cycle. Each tester channel includes one or more timing signal generators producing timing signals for controlling the timing of test events. All timing signal generators receive the same master clock signal and produce edges in their output timing signals in response to pulses of the master clock signal, with delays controlled by the input TSET data from the pattern generator. Each tester channel also includes a formatter circuit receiving the FSET and PG data from the pattern generator and receiving the timing signals produced by the channel's timing signal generators. Various combinations of FSET and PG data values reference test events the channel is to carry out. The formatter circuit responds to the FSET and PG data referencing various drive and compare formats by producing particular output signal patterns that initiate the test event indicated by the FSET and PG data input. The timing of the formatter output signals, and therefore the timing of the test event to be carried out, is controlled by the timing signals produced by the timing circuits.

In accordance with one aspect of the invention, each timing signal generator includes a programmable delay circuit for delaying the generated timing signal by an adjustable amount before the timing signal is delivered to the formatter circuit. Each timing signal generator includes a timing calibration RAM (random access memory) addressed by the FSET and PG data also provided as input to the formatter circuit. When addressed by the FSET and PG data, the timing calibration RAM reads out a calibration data value for controlling the delay of the programmable delay circuit. Thus the delay provided by the programmable delay circuit depends on the event format referenced by the FSET and PG data.

In accordance with another aspect of the invention, the timing of each channel is calibrated by writing appropriate calibration data values into all locations of the timing calibration RAM that may be addressed by FSET and PG data during a test. The calibration data values are adjusted to eliminate event format sensitive variation between the generation of a timing signal and its triggering of an event specified by the FSET and PG data.

It is accordingly an object of the invention to provide a means for calibrating timing signal generators within the various channels of an integrated circuit tester so that the test events they trigger occur at consistent times irrespective of the format of the test event.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

BRIEF DESCRIPTION OF THE DRAWING(S)

FIG. 1 illustrates an integrated circuit tester in accordance with the present invention, FIG. 2 illustrates the formatter circuit of the tester of FIG. 1 in more detailed block diagram form, and FIG. 3 illustrates the period generator and a timing signal generator of the tester of FIG. 1 in more detailed block diagram form.

DESCRIPTION OF THE PREFERRED EMBODIMENT(S)

Tester Architecture

Figure 1:
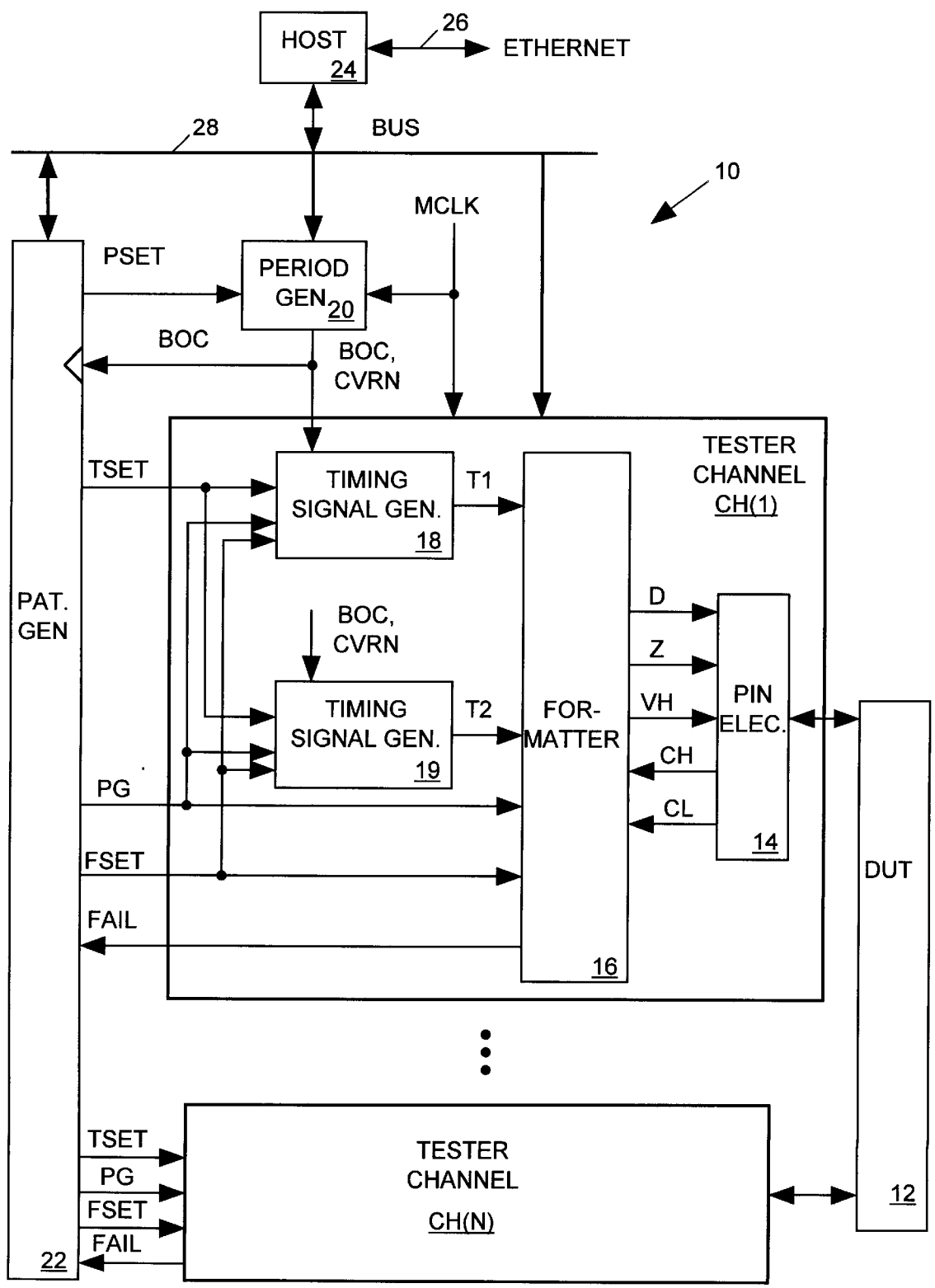

FIG. 1 illustrates an integrated circuit tester 10 in accordance with the present invention. Tester 10 includes a set of N channels CH(1)–CH(N), one for each pin or terminal of an integrated circuit device under test (DUT) 12. Tester 10 organizes a test into a set of successive test cycles and during each test cycle each channel CH(1)–CH(N) carries out one or more test events at a corresponding DUT terminal. Such events may include, for example, a change in state of a test signal the channel provides as input to the DUT terminal or a sample and compare operation on a DUT output signal produced at the terminal.

Tester 10 includes a pattern generation system 22 for producing "period set" data (PSET), "format set" data (FSET), "time set" data (TSET), and reference data (PG) for each test cycle. The PSET data value is supplied to a period generator 20 at the start of each test cycle. Period generator 20 responds to the PSET data value by generating a "beginning of cycle" signal BOC and a data value CVRN. The BOC signal tells each channel CH(1)–CH(N) that the next test cycle is to begin following a next pulse of a master clock signal MCLK. The CVRN data indicates how long after that next MCLK signal the next test cycle actually begins.

A separate set of FSET, PG and TSET data is supplied to each tester channel for each test cycle. The FSET data and PG data together reference a particular drive or compare event the channel is to carry out during the test cycle. A "drive format" is a particular manner in which the channel controls the states of its output test signal during the test cycle. A drive format includes the manner in which the channel acquires data that determines successive test signal states during the test cycle and the manner in which the channel test signal state changes. A "compare format" is a particular manner in which the channel determines whether the DUT output signal is behaving as expected during the test cycle. For compare formats, the PG data indicates expected states of the DUT output signal. The TSET data indicates certain times during a test cycle at which test events within the drive and compare formats referenced by the FSET and PG data are to occur.

Each tester channel CH(1)–CH(N) includes a pin electronics circuit 14 for generating the test signal at DUT 12 in response to a set of drive control signals D, VH and Z. The D control signal tells the pin electronics circuit 14 whether to drive its output test signal to a high or low logic level. The VH control signal tells the pin electronics circuit whether to drive its output voltage to a secondary voltage level. The Z control signal tells pin electronics circuit 14 when to tristate the output test signal. During each test cycle the pin electronics circuit 14 also monitors the DUT output signal (if any) at the DUT terminal and produces compare high and compare low signals (CH and CL) indicating whether the DUT output signal is currently above a high logic level or below a low logic level.

Each tester channel CH(1)–CH(N) also includes a formatter circuit 16 and two timing signal generators 18 and 19. Each timing signal generator 18 or 19 receives the TSET, FSET and PG data from pattern generator 22 and the BOC and CVRN signals from period generator 20. The BOC and CVRN data indicate the start of each test cycle and the TSET, FSET and PG data together tell each timing signal generators 18 and 19 how long to wait after the start of each test cycle before pulsing its output timing signal T1 or T2.

Each channel's formatter circuit 16 receives the FSET and PG data from pattern generator 22 and the T1 and T2 timing signals from signal generators 18 and 19. When the FSET data and PG data reference a drive format, the timing signals T1 and T2 tell formatter circuit 16 when to change states of drive control signals D and Z and VH. The FSET and PG data tell formatter circuit 16 how to change those signal states and which timing signal is to trigger each state change.

When the FSET and PG data reference a compare format formatter circuit 16 samples the compare high CH and CL outputs of pin electronics circuit 14 and determines from the samples whether to assert an output FAIL signal during the test cycle. The FSET data indicates how the formatter is to sample the CH and CL signals and indicates which timing signal T1 and/or T2 is to trigger sampling events specified by the compare format. The PG data references expected states of the CH and CL data. The FAIL signal indicates whether the DUT output signal is of an expected state. During the test, pattern generation system 22 receives, stores and processes FAIL data produced by formatter circuit 16 so that a conventional host computer 24 can obtain and report to the user after the test.

To define a test to be performed, input programming data is supplied to host computer 24 via an Ethernet bus 26. Host computer 24 writes the programming data via a conventional computer bus 28 into various control registers and memories within formatter circuit 16, pattern generator 22, period generator 20, timing generators 18 and 19, and pin electronics circuits 14. As described below, the programming data supplied to pattern generator 22 tells the pattern generator how to produce its output pattern of PSET, TSET, FSET and PG data for each test cycle. The programming data also tells pattern generator 22 how to process the FAIL data signals returned by the tester channels. The programming data written into period generator 20 relates a cycle period length to each possible value of PSET. The programming data supplied to timing generators 18 and 19 relates a particular T1 and T2 timing signal pulse delay to combinations of values of the timing generator's input TSET, FSET and PG data. Programming data supplied to pin electronics circuit 14 sets various operating parameters of DUT 12 including, for example, the high and low levels of its output test signal and high and low logic levels used when establishing the DUT output signal level. The programming data supplied to the formatter 16 of each channel relates particular drive and control formats to the various combinations of FSET and PG data that may be used during the test.

Formatter Circuit

Figure 2:
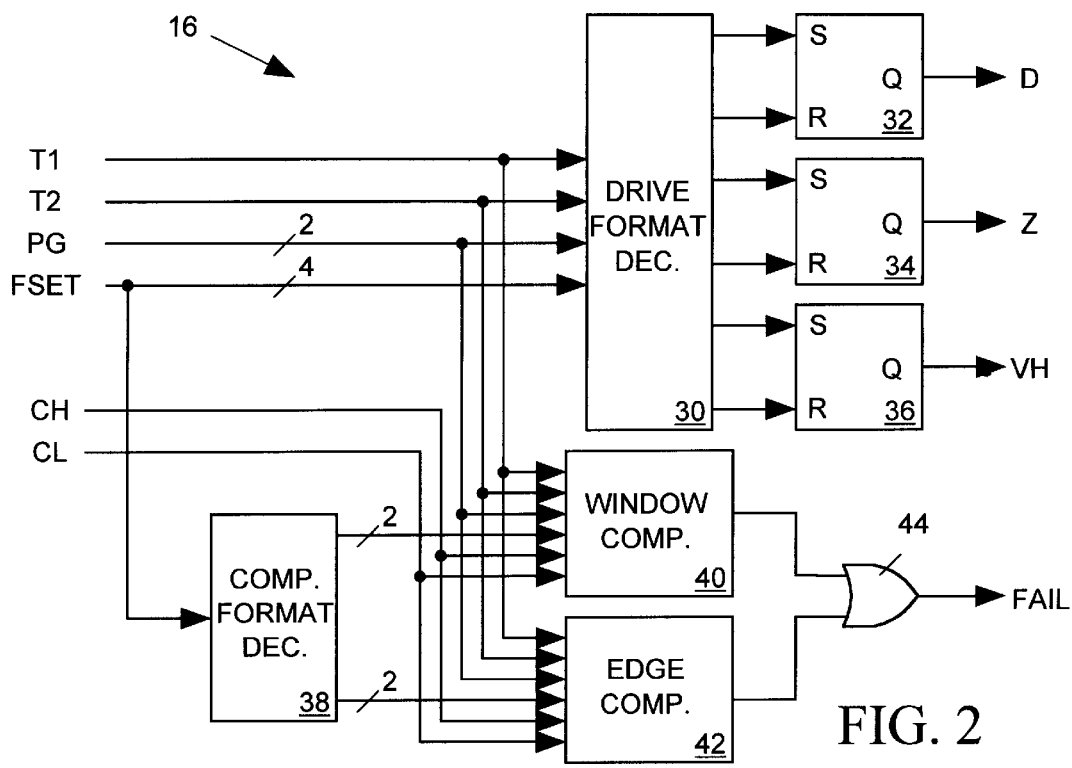

FIG. 2 illustrates formatter circuit 16 of FIG. 1 in more detailed block diagram form. The four-bit FSET and 2-bit PG data produced by pattern generator 22 of FIG. 1, along with the T1 and T2 timing signals produced by timing signal generators 18 and 19 of FIG. 1, provide input to a conventional drive format decoder 30. Decoder 30 produces a set of six output signals for driving set and reset inputs of a set of three flip-flops 32, 34 and 36 for generating the D, Z and VH control signals. Decoder 30 may pulse any of its output signals during each test cycle in response to various combinations of its input FSET and PG data and T1 and T2 timing signals. The FSET data and PG data provided at the start of each test cycle indicate which of its output signals circuit 30 is to pulse during the test cycle and also indicate which of the T1 and T2 timing signals is to control the timing of each of its output signal pulses. Since the T1 and T2 signals each pulse once during the cycle, decoder 30 may set and/or reset any of flip-flops 32, 34 and 36 at either of two times during a test cycle. For example, one value of FSET,PG may tell circuit 30 to set flip-flops 32 and 34 on the T1 signal pulse and reset flip-flop 32 only on the T2 pulse. Another value of FSET,PG may tell decoder 30 to either set or reset flip-flop 32 on the T2 signal pulse depending on the state of the PG data, and do nothing on the T1 timing signal pulse.

As mentioned above, the CH and CL output signals produced by pin electronics circuit 14 of FIG. 1 indicate whether the DUT output signal is above a threshold high logic level or below a threshold low logic level. For compare formats, the PG data output of pattern generator 22 of FIG. 1 indicates the expected states of the CH and CL data. Some values of the FSET data indicate that formatter 16 is to sample the CH and CL signals and to compare their states to the 2-bit PG data to determine whether DUT 12 is behaving as expected. Formatter 16 of FIG. 2 also includes a compare format decoder 38 which decodes the FSET data to produce enabling signals supplied to a window comparator circuit 40 and to an edge comparator circuit 42. Responding to enabling signals from decoder 38, edge comparator 42 samples the CH and CL signals at a time determined by either the T1 or T2 timing signal pulse, compares the sampled CH and CL values to the PG data, and produces an output FAIL signal (via an OR gate 44) indicating when the sampled CH,CL states do not match the PG data. Window comparator 40 responds to enabling signals from decoder 38 by monitoring the CH and CL signals during a window of time marked by the T1 and T2 pulses and producing an output FAIL signal via OR gate 44 when the CH or CL signals take on states that do not match states of the PG data at any time during the time window. Component blocks of formatter 16 of FIG. 2 are well-known to those skilled in the art and are not further detailed herein.

Period Generator

Figure 3:
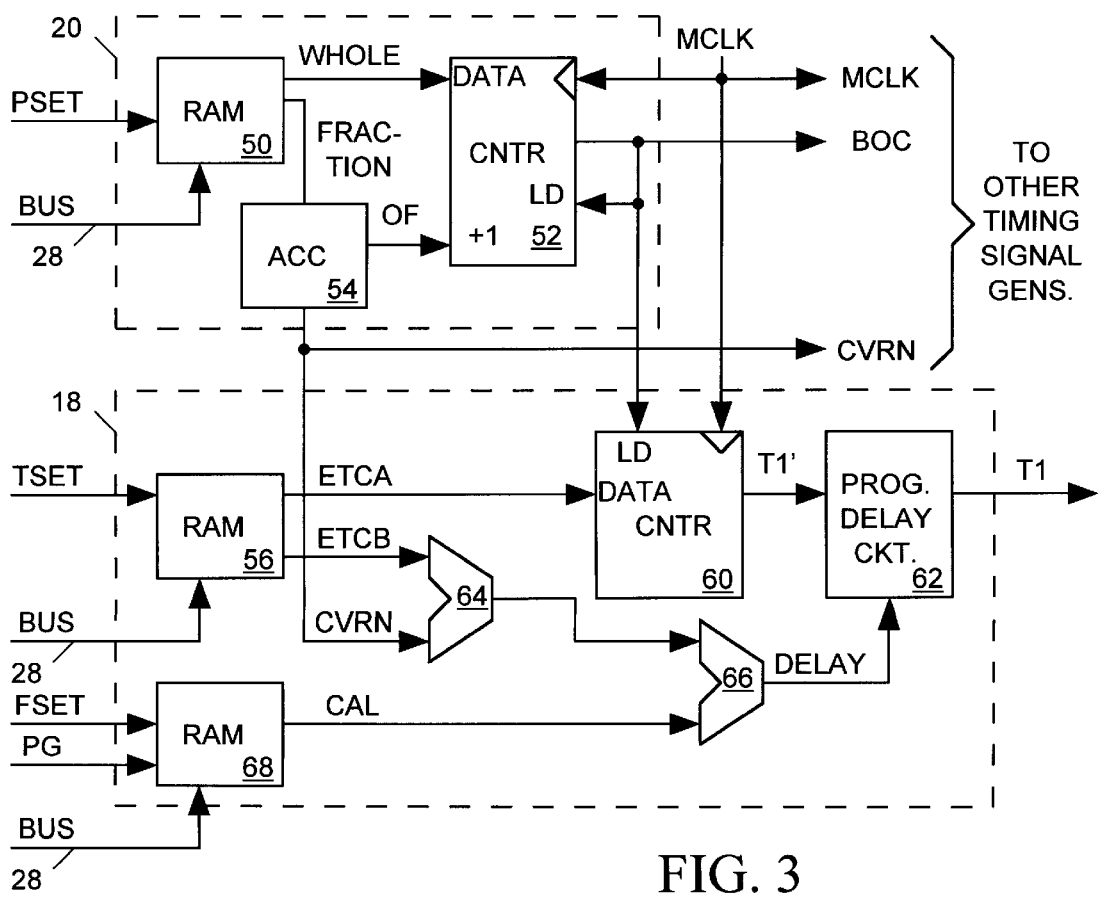

FIG. 3 illustrates period generator 20 and timing signal generator 18 of FIG. 1 in more detailed block diagram form. Timing signal generator 19 of FIG. 1 is similar to timing signal generator 18 and is not separately detailed.

Period generator 20 tells timing signal generators 18 and 19 within all channels CH(l)-CH(N) when each test cycle begins. A test cycle may span a whole and fractional number of cycles of a master clock MCLK. Pattern generator 22 of FIG. 1 supplies a PSET value to period generator 20 at the start of each test cycle, the PSET data indicating how long the test cycle is to last. Period generator 20 responds to the PSET data value by generating a timing reference signal pulse and a data value CVRN. The BOC signal pulse tells each channel CH(1)–CH(N) that the next test cycle is to begin following a next pulse of a master clock signal MCLK. The CVRN data indicates how long after that next MCLK signal the next test cycle actually begins.

Period generator 20 includes a RAM 50, a counter 52 and an accumulator 54. RAM 50, addressed by the PSET data, stores programming data from host 24 of FIG. 1 at each address. Host 24 writes that data into RAM 50 via computer bus 28 before the start of a test. The data in RAM 50 relates each value of PSET to a test cycle length and includes WHOLE and FRACTION values indicating the duration of a test cycle as a combination of a whole number and fractional portion of MCLK signal cycles. On the trailing edge of each BOC signal pulse, the WHOLE data is loaded into counter 52 and the FRACTION data is accumulated by accumulator 54. Counter 52 then begins counting MCLK signal pulses. When its count reaches the integer WHOLE, counter 52 generates a next BOC pulse. The leading edge of the BOC pulse tells pattern generator 22 of FIG. 1 to produce a new PSET value, thereby causing RAM 50 to produce a WHOLE/FRACTION data pair for the next test cycle. Accumulator 54, clocked by the BOC signal, accumulates successive FRACTION data values to produce the CVRN data. Accumulator 54 overflows when the accumulated CVRN data indicates a period greater than one MCLK cycle and provides an overflow signal OF to a +1 input of counter 52. When counter 52 next loads a WHOLE value it sets its count limit to WHOLE+1. Thus the BOC output of counter 52 indicates a last MCLK pulse preceding a start of a next test cycle. The CVRN data indicates a fractional portion of one MCLK cycle following that MCLK pulse that the next test cycle actually begins.

Timing Signal Generator

In order for a test to be successful, the timing of test events at the various terminals of DUT 12 of FIG. 1 must be precisely coordinated. As discussed above, the timing of test events, whether they be changes in state of the D,Z or VH signals or the sampling of the CH and CL signals, is controlled by the timing signal generators 18, 19 within each tester channel CH(1)–CH(N). To facilitate timing coordination between channels, all timing signal generators 18, 19 use the same master clock signal MCLK as a timing reference. For example, suppose DUT 12 is expected to respond to a state change occurring at a time A in an input signal generated by tester channel CH(1) by changing the state of a DUT output signal monitored by tester channel CH(N) at a later time B. In such example pattern generator 22 provides TSET data to timing signal generator 18 of channel CH(1) at the start of the test cycle spanning time A. The TSET data indicates that timing signal generator 18 is to pulse its output T1 signal following the start of the test cycle with a certain delay. Pattern generator 22 also supplies FSET and PG data to the formatter 16 of channel CH(1) at the start of the test cycle spanning time A telling the formatter to drive its output control signal D high in response to the T1 signal. At time A pin electronics circuit 14 responds to the D signal edge by asserting the test signal supplied to DUT 12.

At the start of a test cycle spanning the time B at which DUT 12 is expected to change the state of the output signal monitored by channel CH(N), pattern generator 22 supplies FSET, TSET and PG data to channel CH(N). The FSET data tells the formatter 16 of channel CH(N) to sample the CH and CL output in response to the channel's T1 signal pulse, to compare the results to the PG data states, and to set the FAIL signal accordingly. The TSET data tells timing signal generator 18 of channel CH(N) to produce the T1 signal pulse with a certain delay after the start of the test cycle.

We can see by inspection of FIGS. 1 and 2, that if we want a state change in the test signal output of channel CH(1) to reach the DUT terminal at a particular time A, then timing signal generator 18 must produce the T1 signal that triggers that test signal state change somewhat before time A. We have to allow formatter circuit 16 some time to respond to the T1 signal by changing the state of one or more of the D,Z or VH control signals. We also have to allow pin electronics circuit 14 some time to respond to a state change in the D,Z and/or VH signal before it can change the state of the test signal at the DUT terminal. Thus the T1 output signal of timing signal generator 18 of channel CH(1) must precede time A by the signal path delay between the output of timing signal generator 18 and the DUT 12 terminal accessed by channel CH(1).

We can also see by inspection of FIGS. 1 and 2, that an output signal produced by DUT 12 requires time to reach the comparison circuit within the channel CH(N) pin electronics circuit 14 that produces the CH and CL signals. That comparison circuit will also require some time to produce the CH and CL signals and to send them to the window or edge compare circuit within the CH(N) formatter circuit 16. We should also note that the timing signal T1 that triggers the sampling event in formatter 16 requires a certain amount of time to reach the window or edge compare circuit 40, 42 and trigger the compare event.

Thus if we want channel CH(N) to determine the state of a DUT output signal as it existed at the DUT output terminal at time B, then its timing signal generator 18 will have to delay its generation of the T1 output signal from TIME B by the difference between the path delay between the DUT output terminal and the sampling circuit within its formatter 16 and the path delay between timing signal generator 18 and the window or edge compare circuit 40, 42.

Thus to provide for precise timing of test events, the amount by which the T1 or T2 timing signal is either advanced or delayed from the specified time of a triggered event depends on whether the timing signal is triggering a drive or compare event. The amount of time by which the T1 or T2 signal should be advanced or retarded is also influenced by the nature of the drive or compare format to be carried out because each format requires a different signal path through formatter 16 and pin electronics circuit 14. With regard to drive formats, decoder 30 of FIG. 2 provides a different signal path for each drive format, each having a somewhat different inherent signal path delay. Process differences may also give flip-flops 32, 34 and 36 differing delays. Also the D, Z and CH control signals outputs of formatter 16 follow different paths through pin electronics circuit 14 of FIG. 1, and those paths will have somewhat different delays. With regard to compare formats, window comparator 40 and edge comparator 42 can respond to the T1 and T2 timing signals with different delays.

It should also be noted that the amount of time by which the T1 or T2 timing signals should be advanced or retarded can vary from channel-to-channel. Although all channels CH(1)–CH(N) may be formed by similar integrated circuits, various process and environmental differences can influence their signal path delays. Also the signal path distance between the pin electronics circuit 14 of one channel and the DUT terminal it accesses may vary from channel-to-channel.

Thus we see that the FSET and PG data which determine the format of the test events to be carried out during a test cycle do so by determining the signal paths through which the T1 and T2 timing signal must travel in order to trigger those events. In accordance with the invention, the FSET and PG data is also supplied as input to timing signal generators 18 and 19 of FIG. 1.

Each timing signal generator 18 or 19 pulses its output signal T1 or T2 once after the start of each test cycle with a delay determined not by the TSET input data alone, but by a combination of the TSET, FSET and PG data. While the TSET data indicates a time during a test cycle at which a test event is to occur, the TSET data alone does not specify how long timing signal generator 18 or 19 must wait after the start of the test cycle before generating the T1 or T2 signal that triggers the event.

Timing signal generator 18 includes a RAM 56, addressed by the 4-bit TSET data from pattern generator 22 of FIG. 1. RAM 56 stores timing control data ETCA and ETCB at each address relating each value of TEST to a delay time. Host computer 24 writes that timing control data into RAM 56 via computer bus 28 before the test begins. The BOC signal load enables a counter 60, clocked by the MCLK signal. When load enabled, counter 60 loads the most significant bits (ETCA) of the data output of RAM 56. The ETCA bits indicate a whole number of MCLK clock cycles. The least significant bits (ETCB) of the RAM 56 output indicate an additional fractional portion of an MCLK cycle. After being load enabled by the BOC signal, counter 60 counts MCLK cycles to a count limit indicted by the ETCA data and then produces an output timing signal T1' that goes high after a quantity ETCA of MCLK pulses following a BOC signal pulse. A programmable delay circuit 62 delays the T1' signal by an amount of time indicated by input data DELAY. The delay provided by circuit 62 can range in fractional steps of an MCLK signal cycle from 0 to 3 MCLK signal cycles.

A pair of adders 64 and 66 add the CVRN output of accumulator 54 and a calibration data CAL to ETCB output bits of RAM 36 to produce the DELAY data value. The CVRN data indicates a fractional portion of an MCLK cycle between the BOC signal and the start of the test cycle. The ETCB data indicates a fractional portion of an MCLK cycle of a time interval specified by the TSET data. The calibration data CAL indicates an additional T1 signal delay to be provided by delay circuit 62 to account for above-discussed format variations in T1 signal path delays. The timing calibration data CAL is read out of a RAM 68 addressed by the same FSET and PG data supplied to formatter 16 of FIG. 1 at the start of each test cycle. Before a test begins, a calibration process is carried out in which timing delays for each type of drive and compare format for each tester channel are measured and appropriate calibration data computed and written into RAM 58 for each combination of FSET and PG data values that may be provided during the test. Thereafter, when pattern generator 22 supplies FSET and PG data to formatter circuit 16 of FIG. 1 at the start of a test cycle to indicate what test action the formatter circuit is to carry out, that same PG and FSET data addresses RAM 68 of FIG. 2. The timing calibration data CAL read out of RAM 68 in response the FSET and PG data adjusts the T1 signal delay provided by programmable delay circuit 62 by an amount that is appropriate for test format to be triggered by the T1 signal.

Thus BOC, CVRN and MCLK inputs to timing signal generator 18 together reference a time at which each test cycle begins. The TSET data input to timing signal generator 18 references (via RAM 56) the timing of the test event relative to the start of the test cycle. The FSET and PG data input to timing signal generator 18 reference (via RAM 68) a T1 signal offset relative to the timing of that test event that is appropriate for the type of event to be triggered. When the data in RAM 68 is properly adjusted, format-sensitive event timing errors are eliminated.

Timing Calibration

The timing signals generators 18 and 19 of each tester channel CH(1)–CH(N) may be calibrated by measuring signal path delays for each type of drive or compare format and appropriately adjusting the calibration data written into their calibration RAMs 68.

Drive format timing may be calibrated first. For drive formats, a data value of zero may be initially written into each storage location of the RAM 68 of each tester channel corresponding to a drive format so that all channels provide minimum timing signal delay for all drive formats. With an oscilloscope or other timing measurement device connected to monitor all drive channel test signal outputs, all valid combinations of FSET and PG data which produce test signal state changes are then supplied in sequence to the tester channels. Since the oscilloscope displays the relative timing of state changes at the tester output, the particular combination of tester channel and drive format having the longest path delay can be easily identified. That delay is then chosen as a base timing reference. The calibration data value stored at each address of each RAM 68 of each channel corresponding to a drive format is then iteratively adjusted to find a value resulting in a test signal event timing matching the base timing reference. Thus all channels are calibrated to provide the same signal path delay for all types of drive formats.

The data inputs to each channel are set to tell each channel to produce an output test signal pulse at some particular time A, to also sample its own output test signal at the same time A and to produce a FAIL signal pulse if the sampled test signal is high. If the FAIL signal pulse is produced, then the channel is actually sampling after time A. The calibration data value is therefore decreased to decrease the sampling delay. If no FAIL signal pulse is produced, channel is actually sampling before time A and the calibration data is increased. The process is repeated iteratively for each channel to zero in on a calibration data value for which the smallest change will result in a change in FAIL signal state. At that point, the calibration data will be optimized. This process is carried out to produce separate calibration data values for each edge compare format and for each window edge of each window compare format.

Thus has been shown and described an integrated circuit tester in which the timing of test events can be calibrated to account for format sensitive differences in inherent signal path delay between timing signal generators and the test events they trigger. While the forgoing specification has described preferred embodiment(s) of the present invention, one skilled in the art may make many modifications to the preferred embodiment without departing from the invention in its broader aspects. The appended claims therefore are intended to cover all such modifications as fall within the true scope and spirit of the invention.

What is claimed is:

1. An integrated circuit tester for implementing a succession of timed test events at terminals of an integrated circuit device under test (DUT) during successive test cycles, the apparatus comprising:

pattern generation means for producing for each test cycle a separate set of timing data and format data corresponding to each of the DUT terminals; and a plurality of timing signal generators, each corresponding to a separate one of the DUT terminals, each receiving the corresponding set of timing data and format data from said pattern generation means for each test cycle and each producing an output timing signal during each test cycle, wherein the timing data indicates a time interval, wherein the format data references a test event to be triggered by the output timing signal, and wherein each timing signal generator generates its output timing signal following the start of each test cycle with a delay determined in accordance with a combination of its received timing data and format data.

2. An integrated circuit tester in accordance with claim 1 wherein each timing signal generator comprises:

means for producing a signal pulse following the start of each test cycle by an interval indicated by the received timing data, a random access memory (RAM) addressed by said format data, for storing calibration data at each of a plurality of addressable memory locations, and for reading out calibration data when addressed; and a programmable delay circuit for delaying said signal pulse by a time determined in response to calibration data read out of said RAM.

3. An integrated circuit tester in accordance with claim 1 wherein each timing signal generator comprises:

a first random access memory (RAM) addressed by the received timing data and storing timing control data at each of a plurality of addressable storage locations, said first RAM reading out stored timing control data addressed by said timing data;

a second RAM addressed by said format data and storing calibration data at each of a plurality of addressable memory locations, said second RAM reading out stored calibration data addressed by said format data; and means for generating said timing signal following the start of each test cycle with a delay determined in accordance with a combination of the timing control data read out of said first RAM and the calibration data read out of said second RAM.

4. The integrated circuit tester in accordance with claim 3 further comprising means corresponding to each timing signal generator for receiving the output timing signal produced thereby, for receiving the same format data received by the corresponding timing signal generator, and for implementing a test event referenced by the received format data upon receiving the output timing signal.

5. The integrated circuit tester in accordance with claim 1 further comprising means corresponding to each timing signal generator for receiving the output timing signal produced thereby, for receiving the same format data received by the corresponding timing signal generator, and for implementing a test event referenced by the received format data upon receiving the output timing signal.

6. An integrated circuit tester in accordance with claim 1 wherein each timing signal generator comprises:

a first random access memory (RAM) addressed by said timing data and storing first timing control data at each of a plurality of addressable storage locations, said first RAM reading out stored timing control data when addressed by said timing data, wherein the read out timing control data consists of first and second portions;

a second RAM addressed by said format data and storing calibration data at each of a plurality of addressable memory locations, said second RAM reading out stored calibration data addressed by said format data;

a counter for generating an output pulse when a number of cycles of an input clock signal occurring since the start of each test cycle reaches a limit indicated by said first portion of said timing control data read out of said first RAM;

means for logically combining the calibration data read out of said second RAM with the second portion of the timing control data read out of said first RAM to produce delay control data; and means for delaying the counter output pulse by a time determined by said delay control data thereby to produce said output timing signal.

7. The integrated circuit tester in accordance with claim 6 further comprising means corresponding to each timing signal generator for receiving the output timing signal produced thereby, for receiving the same format data received by the corresponding timing signal generator, and for implementing a test event referenced by the received format data upon receiving the output timing signal.

8. An integrated circuit tester for implementing a succession of timed test events at terminals of an integrated circuit device under test (DUT) during successive test cycles, the apparatus comprising:

pattern generation means for producing period data and a plurality of sets of format and timing data for each test cycle, the period data indicating the duration of the test cycle, each set of timing and format data corresponding to a separate DUT terminal, the format data referencing a test event to be carried out at the corresponding terminal during the test cycle, and the timing data referencing a time interval;

period generator means receiving the period data produced by said pattern generation means and generating in response thereto a period generator output indicating a start of each test cycle; and a plurality of timing signal generators, each corresponding to a separate one of the DUT terminals, each receiving a corresponding set of timing data and format data from said pattern generation means at the start of each test cycle, each receiving the period generator output, and each generating an output timing signal following the start of the test cycle with a first delay determined in accordance with a combination of the received timing data and format data.

9. An integrated circuit tester in accordance with claim 8 wherein each timing signal generator comprises:

means for producing a signal pulse following the start of each test cycle indicated by the received period generator output by with a second delay by the received timing data, a random access memory (RAM) addressed by said format data, for storing calibration data at each of a plurality of addressable memory locations, and for reading out calibration data when addressed; and a programmable delay circuit for delaying said signal pulse by a time determined in response to calibration data read out of said RAM.

10. An integrated circuit tester in accordance with claim 8 wherein said period generator output comprises a beginning of cycle (BOC) signal pulse indicating that a next test cycle is to begin following a next pulse of an input master clock signal, and wherein said period generator output also comprises period start data indicating an interval between said next pulse of said master clock signal and the start of said next test cycle.

11. The integrated circuit tester in accordance with claim 10 wherein each timing signal generator comprises:

a first random access memory (RAM) addressed by the received timing data and storing timing control data at each of a plurality of addressable storage locations, said first RAM reading out stored timing control data addressed by said timing data;

a second RAM addressed by said format data and storing calibration data at each of a plurality of addressable memory locations, said second RAM reading out stored calibration data addressed by said format data; and means for generating said output timing signal following the start of each test cycle with a delay following said BOC signal pulse determined in accordance with a combination of the timing control data read out of said first RAM, the calibration data read out of said second RAM and said period start data.

12. An integrated circuit tester in accordance with claim 10 wherein each timing signal generator comprises:

a first random access memory (RAM) addressed by said timing data and storing first timing control data at each of a plurality of addressable storage locations, said first RAM reading out stored timing control data when addressed by said timing data, wherein the read out timing control data consists of first and second portions;

a second RAM addressed by said format data and storing calibration data at each of a plurality of addressable memory locations, said second RAM reading out stored calibration data addressed by said format data;

a counter for generating an output pulse when a number of pulses of said master clock signal occurring since a last BOC signal pulse reaches a limit indicated by said first portion of said timing control data read out of said first RAM;

means for logically combining the calibration data read out of said second RAM, the second portion of the timing control data read out of said first RAM, and said period start data generated by said period generator to produce delay control data; and means for delaying the counter output pulse by a time determined by said delay control data thereby to produce said output timing signal.

13. The integrated circuit tester in accordance with claim 12 further comprising means corresponding to each timing signal generator for receiving the output timing signal produced thereby, for receiving the same format data received by the corresponding timing signal generator, and for implementing a test event referenced by the received format data upon receiving the output timing signal.

14. The integrated circuit tester in accordance with claim 10 further comprising means corresponding to each timing signal generator for receiving the output timing signal produced thereby, for receiving the same format data received by the corresponding timing signal generator, and for implementing a test event referenced by the received format data upon receiving the output timing signal.

15. The integrated circuit tester in accordance with claim 8 further comprising means corresponding to each timing signal generator for receiving the output timing signal produced thereby, for receiving the same format data received by the corresponding timing signal generator, and for implementing a test event referenced by the received format data upon receiving the output timing signal.

* * * * *

UNITED STATES PATENT AND TRADEMARK OFFICE
CERTIFICATE OF CORRECTION

PATENT NO.   : 6,060,898
DATED        : May 9, 2000
INVENTOR(S)  : Brian J. ARKIN It is certified that error appears in the above-identified patent and that said Letters Patent is hereby corrected as shown below:

Column 12, line 44 (claim 9, line 5), after "delay" should be inserted --indicated--.

Signed and Sealed this

Twentieth Day of February, 2001

Attest:

NICHOLAS P. GODICI

Attesting Officer    Acting Director of the United States Patent and Trademark Office